US012117706B2

(12) United States Patent
Hara et al.

(10) Patent No.: US 12,117,706 B2
(45) Date of Patent: Oct. 15, 2024

(54) ACTIVE MATRIX SUBSTRATE AND LIQUID CRYSTAL DISPLAY DEVICE

(71) Applicant: Sharp Display Technology Corporation, Kameyama (JP)

(72) Inventors: Kengo Hara, Kameyama (JP); Tohru Daitoh, Kameyama (JP); Yoshihito Hara, Kameyama (JP); Jun Nishimura, Kameyama (JP); Yohei Takeuchi, Kameyama (JP)

(73) Assignee: Sharp Display Technology Corporation, Mie (JP)

( * ) Notice: Subject to any disclaimer, the term of this patent is extended or adjusted under 35 U.S.C. 154(b) by 0 days.

(21) Appl. No.: 18/407,420

(22) Filed: Jan. 8, 2024

(65) Prior Publication Data

US 2024/0288738 A1    Aug. 29, 2024

(30) Foreign Application Priority Data

Feb. 27, 2023  (JP) .................. 2023-027919

(51) Int. Cl.
    *G02F 1/1362*    (2006.01)
    *G02F 1/1368*    (2006.01)
    *H01L 27/12*     (2006.01)

(52) U.S. Cl.
    CPC ........ *G02F 1/13629* (2021.01); *G02F 1/1368* (2013.01); *H01L 27/124* (2013.01)

(58) Field of Classification Search
    CPC ... G02F 1/1368; G02F 1/13629; H01L 27/124
    See application file for complete search history.

(56) References Cited

U.S. PATENT DOCUMENTS

| 5,212,574 A * | 5/1993 | Katayama ......... G02F 1/136213 349/147 |
| 2011/0109351 A1* | 5/2011 | Yamazaki ......... H01L 29/78678 257/E29.296 |
| 2011/0127524 A1* | 6/2011 | Yamazaki ........... H01L 33/0041 257/43 |
| 2011/0133191 A1* | 6/2011 | Yamazaki ......... H01L 29/78648 257/E21.414 |

(Continued)

FOREIGN PATENT DOCUMENTS

| JP | 2012-134475 A | 7/2012 |
| JP | 2016-184739 A | 10/2016 |

*Primary Examiner* — James A Dudek
(74) *Attorney, Agent, or Firm* — ScienBiziP, P.C.

(57) ABSTRACT

An active matrix substrate includes a pixel TFT provided corresponding to each pixel region, a pixel electrode electrically connected to the pixel TFT, a plurality of gate wirings extending in a row direction, and a plurality of source wirings extending in a column direction. Each gate wiring has a multilayer structure including a lower gate wiring electrically connected to a lower gate electrode included in the pixel TFT and an upper gate wiring electrically connected to an upper gate electrode included in the pixel TFT. In a case where the number of the gate wirings is defined as m and the number of the source wirings is defined as n, each gate wiring has 3 or more and less than n contact portions, each contact portion is positioned in any of n intersection regions, and the number of the contact portions overlapping each source wiring is less than m.

9 Claims, 19 Drawing Sheets

(56) References Cited

U.S. PATENT DOCUMENTS

| | | |
|---|---|---|
| 2011/0266542 A1* | 11/2011 | Ryu .................... H01L 27/1225 |
| | | 257/66 |
| 2012/0138922 A1 | 6/2012 | Yamazaki et al. |
| 2013/0214273 A1 | 8/2013 | Yamazaki et al. |
| 2013/0249817 A1* | 9/2013 | Jung .................... H01L 31/167 |
| | | 345/212 |
| 2014/0183532 A1 | 7/2014 | Yamazaki et al. |
| 2015/0179805 A1 | 6/2015 | Yamazaki et al. |
| 2015/0333090 A1 | 11/2015 | Yamazaki et al. |
| 2016/0240694 A1 | 8/2016 | Yamazaki et al. |
| 2017/0250201 A1 | 8/2017 | Yamazaki et al. |
| 2017/0309754 A1 | 10/2017 | Yamazaki et al. |
| 2018/0308989 A1 | 10/2018 | Yamazaki et al. |
| 2019/0035818 A1 | 1/2019 | Yamazaki et al. |
| 2020/0219905 A1 | 7/2020 | Yamazaki et al. |
| 2021/0159345 A1 | 5/2021 | Yamazaki et al. |
| 2022/0165758 A1 | 5/2022 | Yamazaki et al. |
| 2023/0361128 A1 | 11/2023 | Yamazaki et al. |

* cited by examiner

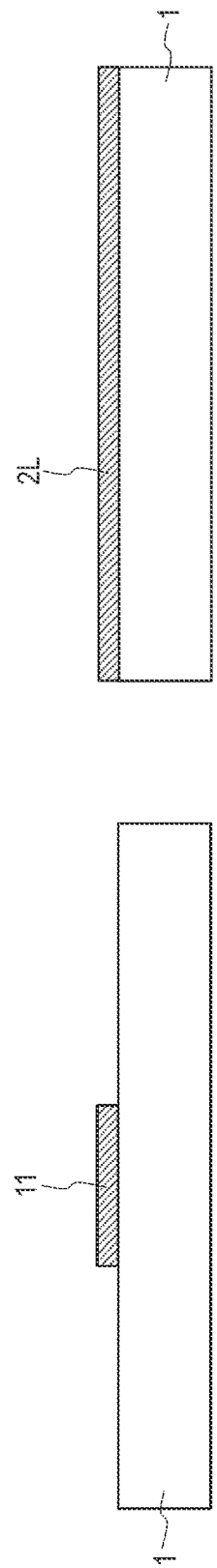

ACTIVE MATRIX SUBSTRATE AND LIQUID CRYSTAL DISPLAY DEVICE

BACKGROUND

1. Field

The present disclosure relates to an active matrix substrate, and particularly, to an active matrix substrate including an oxide semiconductor TFT. Further, the present disclosure also relates to a liquid crystal display device including the active matrix substrate.

2. Description of the Related Art

Currently, a liquid crystal display device including an active matrix substrate provided with a switching element for each pixel is widely used. An active matrix substrate provided with a thin film transistor (hereinafter, referred to as a "TFT") as a switching element is referred to as a TFT substrate. In the present specification, the TFT provided in each pixel of the active matrix substrate may be referred to as a "pixel TFT".

In recent years, it has been proposed to use an oxide semiconductor instead of amorphous silicon or polycrystalline silicon as a material for an active layer of the TFT. A TFT including an oxide semiconductor film as an active layer is referred to as an "oxide semiconductor TFT". Japanese Unexamined Patent Application Publication No. 2012-134475 discloses an active matrix substrate using an In—Ga—Zn—O-based semiconductor film as an active layer of a TFT.

The oxide semiconductor has higher mobility than amorphous silicon. Therefore, the oxide semiconductor TFT can operate at higher speed than an amorphous silicon TFT. Since an oxide semiconductor film is formed by a simpler process than that of a polycrystalline silicon film, the oxide semiconductor film can be applied to an apparatus which requires a large area.

However, the mobility of the oxide semiconductor is higher than mobility of the amorphous silicon, but is lower than mobility of polycrystalline silicon. Therefore, recently, further improvement of driving capability of the oxide semiconductor TFT is demanded.

A double gate structure has been proposed as a method for improving the driving capability of the oxide semiconductor TFT. In the oxide semiconductor TFT having the double gate structure, a pair of gate electrodes is provided to interpose an oxide semiconductor layer. That is, a gate electrode (hereinafter, referred to as a "lower gate electrode") is provided below the oxide semiconductor, and a gate electrode (hereinafter, referred to as an "upper gate electrode") is provided above the oxide semiconductor layer. The oxide semiconductor TFT having the double gate structure is disclosed in Japanese Unexamined Patent Application Publication No. 2016-184739, for example.

In an oxide semiconductor TFT having a double gate structure, in a case where a lower gate electrode and an upper gate electrode are brought to the same potential, it is desirable to provide a contact portion for electrically connecting both. However, a suitable arrangement of the contact portion in a case where the oxide semiconductor TFT is used as a pixel TFT has not been found yet. Japanese Unexamined Patent Application Publication No. 2016-184739 has no description of the arrangement of the contact portion.

An embodiment of the present disclosure is made in view of the above problems, and it is desirable to realize suitable arrangement of a contact portion electrically connecting a lower gate electrode and an upper gate electrode in an active matrix substrate including an oxide semiconductor TFT having a double gate structure.

SUMMARY

According to an aspect of the disclosure, there is provided an active matrix substrate having a display region defined by a plurality of pixel regions arranged in a matrix including a plurality of rows and a plurality of columns, the active matrix substrate including:
  a substrate;
  a pixel TFT that is supported by the substrate and provided corresponding to each of the plurality of pixel regions;
  a pixel electrode that is electrically connected to the pixel TFT;
  a plurality of gate wirings extending in a row direction, each of which supplies a gate signal to a corresponding pixel TFT; and
  a plurality of source wirings extending in a column direction, each of which supplies a source signal to a corresponding pixel TFT,
  in which the pixel TFT includes
  a lower gate electrode that is provided on the substrate,
  a lower gate insulating layer that covers the lower gate electrode,
  an oxide semiconductor layer provided on the lower gate insulating layer and including a channel region facing the lower gate electrode via the lower gate insulating layer, and a source contact region and a drain contact region positioned on both sides of the channel region,
  an upper gate insulating layer that is provided on the channel region of the oxide semiconductor layer, and
  an upper gate electrode that is provided on the upper gate insulating layer and faces the channel region of the oxide semiconductor layer via the upper gate insulating layer,
  each gate wiring has a multilayer structure including a lower gate wiring electrically connected to the lower gate electrode and an upper gate wiring electrically connected to the upper gate electrode, and
  in a case where the number of the plurality of gate wirings is defined as m and the number of the plurality of source wirings is defined as n,
  each of the gate wirings has 3 or more and less than n contact portions in which the lower gate wiring and the upper gate wiring are electrically connected to each other, each contact portion is positioned in any of n intersection regions in which the gate wiring and the plurality of source wirings intersect each other, and the number of the contact portions overlapping each source wiring is less than m.

According to another aspect of the disclosure, there is provided a liquid crystal display device including:
  the active matrix substrate according to any one of Items 1 to 8;
  a counter substrate provided to face the active matrix substrate; and
  a liquid crystal layer provided between the active matrix substrate and the counter substrate.

BRIEF DESCRIPTION OF THE DRAWINGS

FIG. 8A is a step sectional view showing a manufacturing step of an active matrix substrate;

DESCRIPTION OF THE EMBODIMENTS

Hereinafter, embodiments of the present disclosure will be described with reference to the drawings, but present disclosure is not limited to the following embodiments. Hereinafter, an active matrix substrate for a liquid crystal display device will be described as an example.

Embodiment 1

Figure 1:
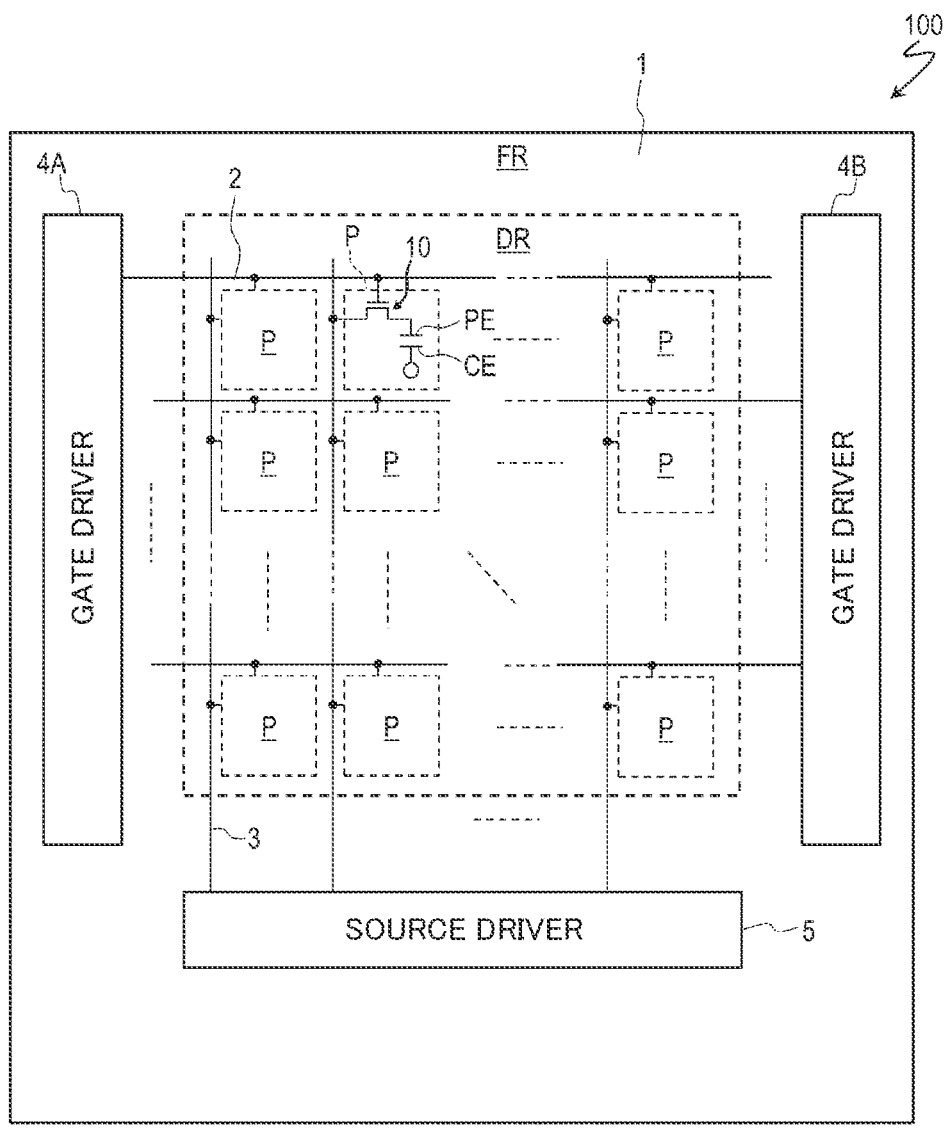
FIG. 1 is a schematic diagram showing an example of a planar structure of an active matrix substrate according to an embodiment of the present disclosure.

First, an outline configuration of an active matrix substrate 100 of the present embodiment will be described with reference to FIG. 1. FIG. 1 is a schematic diagram showing an example of a planar structure of the active matrix substrate 100.

As shown in FIG. 1, the active matrix substrate 100 includes a display region DR and a non-display region (also referred to as a "picture-frame region") FR. The display region DR is defined by a plurality of pixel regions P. The plurality of pixel regions P are arranged in a matrix including a plurality of rows and a plurality of columns. The pixel region P is a region corresponding to a pixel of a liquid crystal display device, and the pixel region P may also be simply referred to as a "pixel". The non-display region FR is a region located around the display region DR and does not contribute to display.

Constituent elements of the active matrix substrate 100 are supported by a substrate 1. The substrate 1 is, for example, a glass substrate.

A plurality of gate wirings (scanning wirings) 2 extending in a row direction and a plurality of source wirings (signal wirings) 3 extending in a column direction are provided on the substrate 1. Typically, a region surrounded by two adjacent gate wirings 2 and two adjacent source wirings 3 is the pixel region P. Each pixel region P of the display region DR includes a thin film transistor (hereinafter, referred to as a "pixel TFT") 10 and a pixel electrode PE.

The pixel TFT 10 provided corresponding to each pixel region P is supported by the substrate 1, supplied with a gate signal (scanning signal) from the corresponding gate wiring 2, and supplied with a source signal (display signal) from the corresponding source wiring 3. Although simply shown in FIG. 1, the pixel TFT 10 has a double gate structure as will be described later.

The pixel electrode PE is electrically connected to the pixel TFT 10. In a case where the active matrix substrate 100 is used in a liquid crystal display device in a horizontal electric field mode such as a fringe field switching (FFS) mode, an electrode CE common for the plurality of pixel regions P (common electrode) is provided on the active matrix substrate 100. In a case where the active matrix substrate 100 is applied to a liquid crystal display device in a vertical electric field mode, the common electrode CE is provided on a counter substrate disposed to face the active matrix substrate 100 via a liquid crystal layer.

Peripheral circuits are disposed in the non-display region FR. Here, in the non-display region FR, gate drivers (gate wiring drive circuits) 4A and 4B for driving the gate wiring 2 are integrally (monolithically) formed, and a source driver (source wiring drive circuit) 5 for driving the source wiring 3 is mounted (for example, COG mounting).

In the example shown in the drawing, the gate driver 4A for driving the gate wiring 2 in an odd row is disposed on the left side of the display region DR, and the gate driver 4B for driving the gate wiring 2 in an even row is disposed on the right side of the display region DR. The gate wiring 2 in the odd row is connected to a plurality of output terminals (not shown) included in the gate driver 4A. In addition, the gate wiring 2 in the even row is connected to a plurality of output terminals (not shown) included in the gate driver 4B.

In addition, in the example shown in the drawing, the source driver 5 is disposed on a lower side of the display region DR. The source wiring 3 is connected to a plurality of output terminals (not shown) included in the source driver 5.

In the non-display region FR, a source switching (source shared driving (SSD)) circuit for driving the source wiring 3 in a time-division manner or the like may be further disposed, and the SSD circuit or the like may be formed monolithically in the same manner as the gate drivers 4A and 4B.

Figure 2:
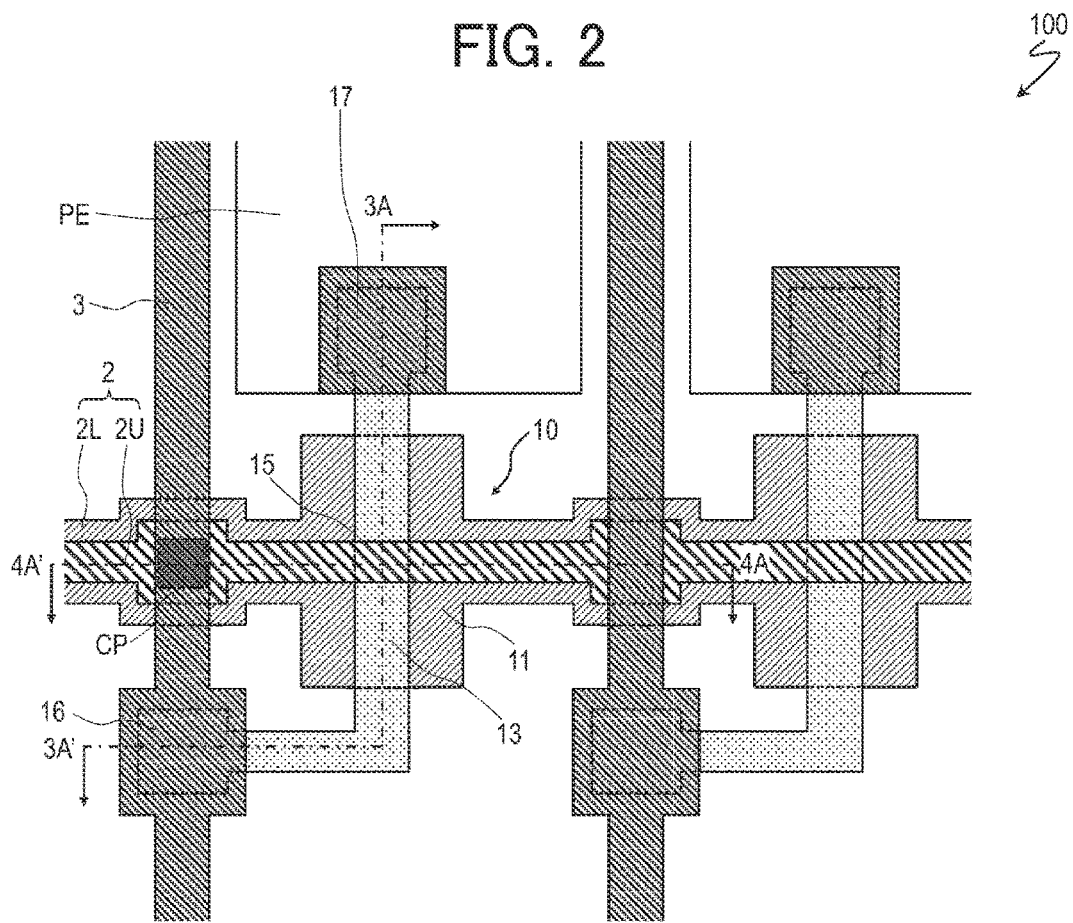
FIG. 2 is a plan view schematically showing an active matrix substrate.
Figure 3:
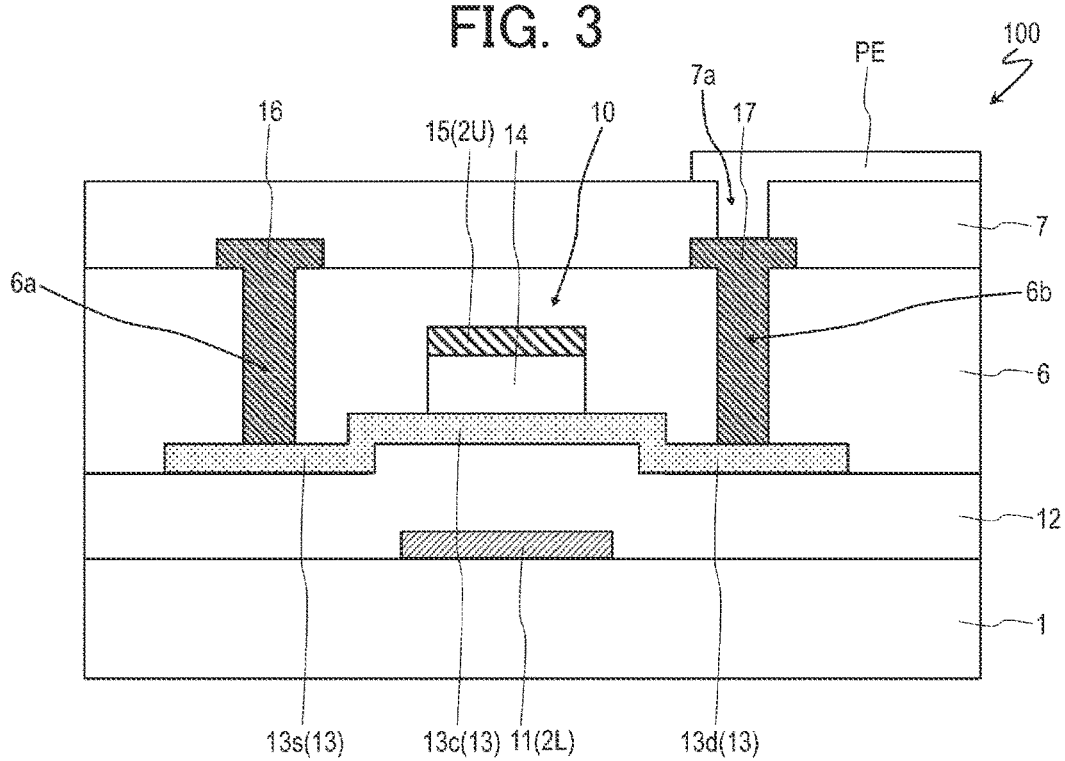
FIG. 3 is a cross-sectional view schematically showing an active matrix substrate taken along a line 3A-3A' of FIG. 2.
Figure 4:
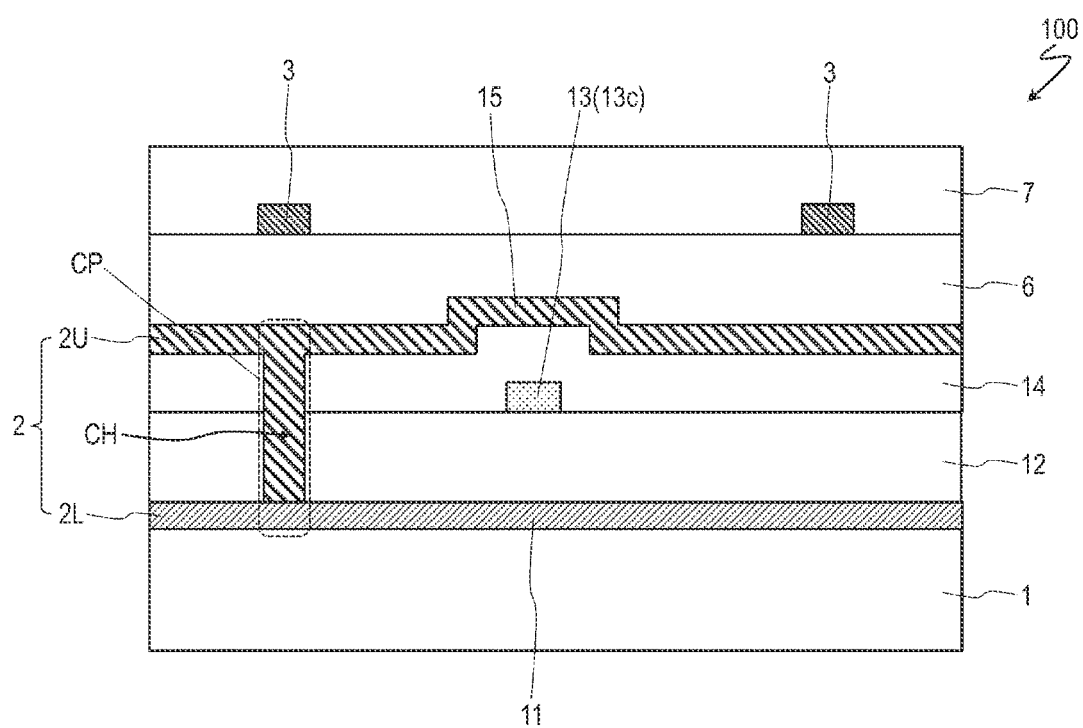
FIG. 4 is a cross-sectional view schematically showing an active matrix substrate taken along a line 4A-4A' of FIG. 2.

Next, a more specific configuration of the active matrix substrate 100 will be described with reference to FIGS. 2, 3, and 4. FIG. 2 is a plan view schematically showing the active matrix substrate 100. FIGS. 3 and 4 are cross-sectional views schematically showing the active matrix substrate 100 taken along a line 3A-3A' and a line 4A-4A' of FIG. 2, respectively.

As shown in FIGS. 2, 3, and 4, the active matrix substrate 100 includes the substrate 1, the gate wiring 2, the source wiring 3, the pixel TFT 10, and the pixel electrode PE.

The substrate 1 is transparent and has an insulating property. The substrate 1 is, for example, a glass substrate or a plastic substrate.

As described above, the gate wiring 2 extends in the row direction, and the source wiring 3 extends in the column direction. In the present embodiment, each gate wiring 2 has a multilayer structure including a lower gate wiring 2L and an upper gate wiring 2U. The lower gate wiring 2L and the upper gate wiring 2U at least partially overlap each other via a lower gate insulating layer 12 and an upper gate insulating layer 14 which will be described later.

The pixel TFT 10 includes a lower gate electrode 11, a lower gate insulating layer 12, an oxide semiconductor layer 13, an upper gate insulating layer 14, an upper gate electrode 15, a source electrode 16, and a drain electrode 17. That is, the pixel TFT 10 has a double gate structure.

The lower gate electrode 11 is provided on the substrate 1. The lower gate electrode 11 is electrically connected to the corresponding lower gate wiring 2L. In the example shown in the drawing, a portion of the lower gate wiring 2L (specifically, a portion facing the oxide semiconductor layer 13) functions as the lower gate electrode 11. That is, the lower gate electrode 11 and the lower gate wiring 2L are formed in the same layer. The lower gate insulating layer 12 covers the lower gate electrode 11.

The oxide semiconductor layer 13 is provided on the lower gate insulating layer 12. The oxide semiconductor layer 13 includes a channel region 13c facing the lower gate electrode 11 via the lower gate insulating layer 12, and a source contact region 13s and a drain contact region 13d positioned on both sides of the channel region 13c.

The upper gate insulating layer 14 is provided on the channel region 13c of the oxide semiconductor layer 13. The upper gate electrode 15 is provided on the upper gate insulating layer 14 and faces the channel region 13c of the oxide semiconductor layer 13 via the upper gate insulating layer 14. The upper gate electrode 15 is electrically connected to the corresponding upper gate wiring 2U. In the example shown in the drawing, a portion of the upper gate wiring 2U (specifically, a portion facing the oxide semiconductor layer 13) functions as the upper gate electrode 15. That is, the upper gate electrode 15 and the upper gate wiring 2U are formed in the same layer. In the present embodiment, the same potential is applied to the lower gate electrode 11 and the upper gate electrode 15.

An interlayer insulating layer 6 is provided to cover the upper gate electrode 15 and the oxide semiconductor layer 13. The source electrode 16 and the drain electrode 17 are provided on the interlayer insulating layer 6.

A source contact hole 6a and a drain contact hole 6b are formed in the interlayer insulating layer 6 so that a portion of the source contact region 13s and a portion of the drain contact region 13d of the oxide semiconductor layer 13 are exposed. The source electrode 16 is in contact with the source contact region 13s in the source contact hole 6a and is electrically connected to the source contact region 13s. The drain electrode 17 is in contact with the drain contact region 13d in the drain contact hole 6b and is electrically connected to the drain contact region 13d.

The source electrode 16 is electrically connected to the corresponding source wiring 3. In the example shown in the drawing, a portion of the source wiring 3 (specifically, a portion facing the oxide semiconductor layer 13) functions as the source electrode 16. That is, the source electrode 16 and the source wiring 3 are formed in the same layer.

A flattening layer 7 is formed to cover the pixel TFT 10. The flattening layer 7 is formed of, for example, a photo-sensitive resin material. The pixel electrode PE is provided on the flattening layer 7. The pixel electrode PE is formed of a transparent conductive material (for example, ITO). A pixel contact hole 7a is formed in the flattening layer 7 so that a portion of the drain electrode 17 is exposed. The pixel electrode PE is in contact with the drain electrode 17 in the pixel contact hole 7a and is electrically connected to the drain electrode 17. Although not shown here, an alignment film is formed to cover the pixel electrode PE.

In the present embodiment, as described above, each gate wiring 2 has a multilayer structure including the lower gate wiring 2L electrically connected to the lower gate electrode 11 and the upper gate wiring 2U electrically connected to the upper gate electrode 15. Each gate wiring 2 includes a predetermined number of contact portions CP for electrically connecting the lower gate wiring 2L and the upper gate wiring 2U. Specifically, in a case where the number of gate wirings 2 is defined as m (m is an integer of 2 or more) and the number of source wirings 3 is defined as n (n is an integer of 2 or more), each gate wiring 2 includes 3 or more and less than n contact portions CP. That is, when focusing on one gate wiring 2, the number of contact portions CP is more than two and less than the number of source wirings 3.

In the example shown in FIG. 4, in each contact portion CP, the contact hole CH is formed in the lower gate insulating layer 12 and the upper gate insulating layer 14, and the lower gate wiring 2L and the upper gate wiring 2U are in contact in this contact hole CH, and accordingly, the lower gate wiring 2L and the upper gate wiring 2U are electrically connected to each other.

When focusing on one gate wiring 2, there are n regions (hereinafter, referred to as "intersection regions") where the gate wiring 2 and the n source wirings 3 intersect each other. Each contact portion CP is positioned in any one of the n intersection regions. As described above, the number of contact portions CP of each gate wiring 2 is less than the number of the source wirings 3. Therefore, for each gate wiring 2, the contact portion CP is not provided in all the intersection regions. In other words, for each gate wiring 2, the contact portion CP is selectively provided only in some intersection regions of the n intersection regions. There are two intersection regions in each of the regions shown in FIGS. 2 and 4. The contact portion CP is provided in a left intersection region, whereas the contact portion CP is not provided in a right intersection region.

In addition, the number of contact portions CP overlapping each source wiring 3 is less than m. That is, the number of contact portions CP overlapping one source wiring 3 is less than the number of gate wirings 2.

Figure 5:
FIG. 5 is a diagram showing an example of arrangement of contact portions in an active matrix substrate.

FIG. 5 shows an example of the arrangement of the contact portion CP of the present embodiment. In the example shown in FIG. 5, the contact portion CP is provided at a ratio of one to nine pixels P. In addition, the contact portion CP of an a-th gate wiring 2 (a is an arbitrary integer) and the contact portion CP of a (a+1)-th gate wiring 2 are shifted from each other by one pixel in the row direction. The example of the arrangement shown in FIG. 5 is merely an example, and the arrangement of the contact portions CP is not limited thereto.

In the active matrix substrate 100 of the present embodiment, an effect described below can be obtained by the configuration described above. Hereinafter, the effect of the active matrix substrate 100 of the present embodiment will be described by comparing with an active matrix substrate 800 of Comparative Example 1 shown in FIG. 6 and an active matrix substrate 900 of Comparative Example 2 shown in FIG. 7.

Figure 6:
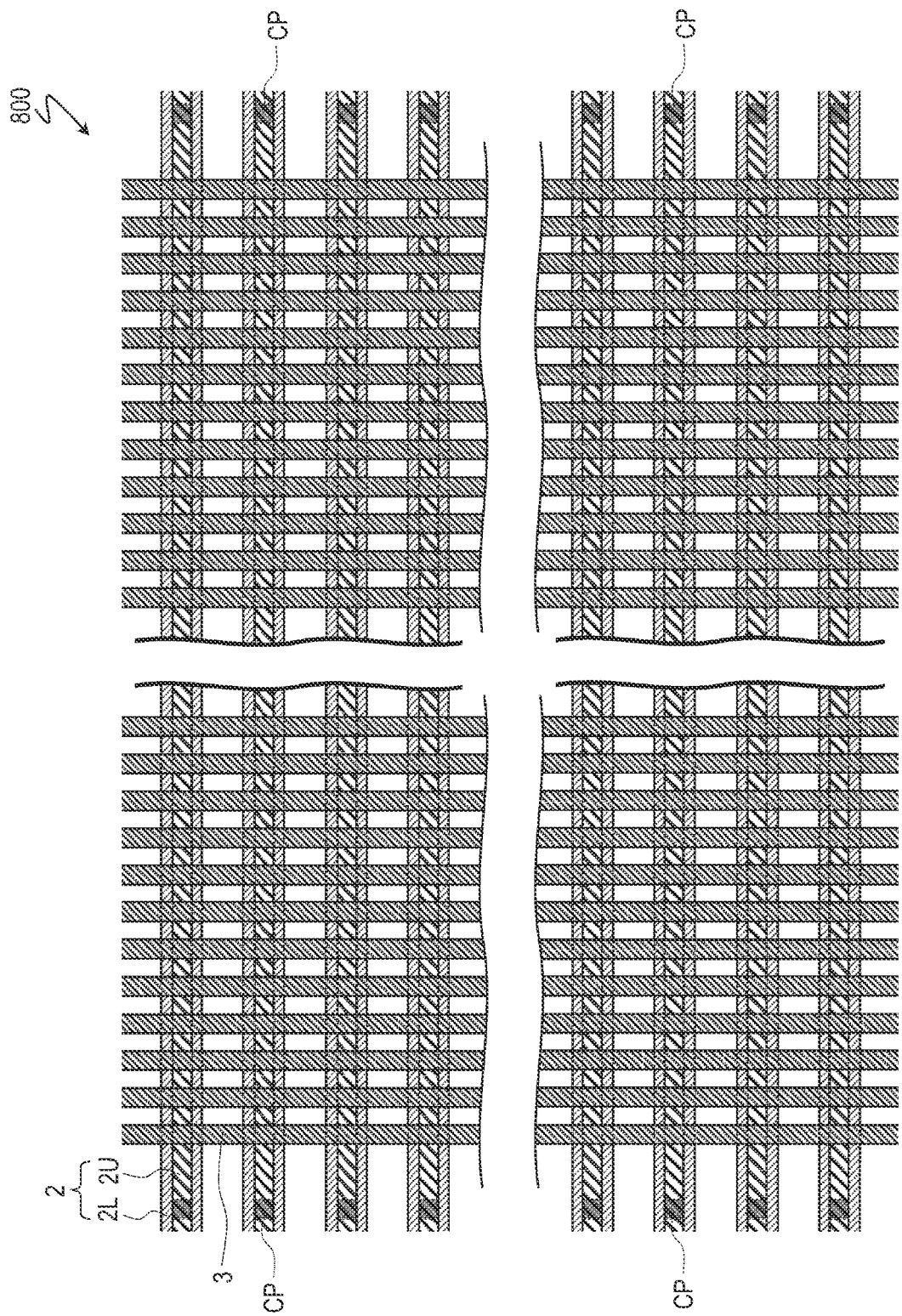
FIG. 6 is a diagram showing an example of arrangement of contact portions in an active matrix substrate of Comparative Example 1.

In the active matrix substrate 800 of Comparative Example 1, as shown in FIG. 6, the contact portions CP are provided only on both end portions of each gate wiring 2. That is, each gate wiring 2 has two contact portions CP. In addition, the contact portion CP does not overlap the source wiring 3.

Figure 7:
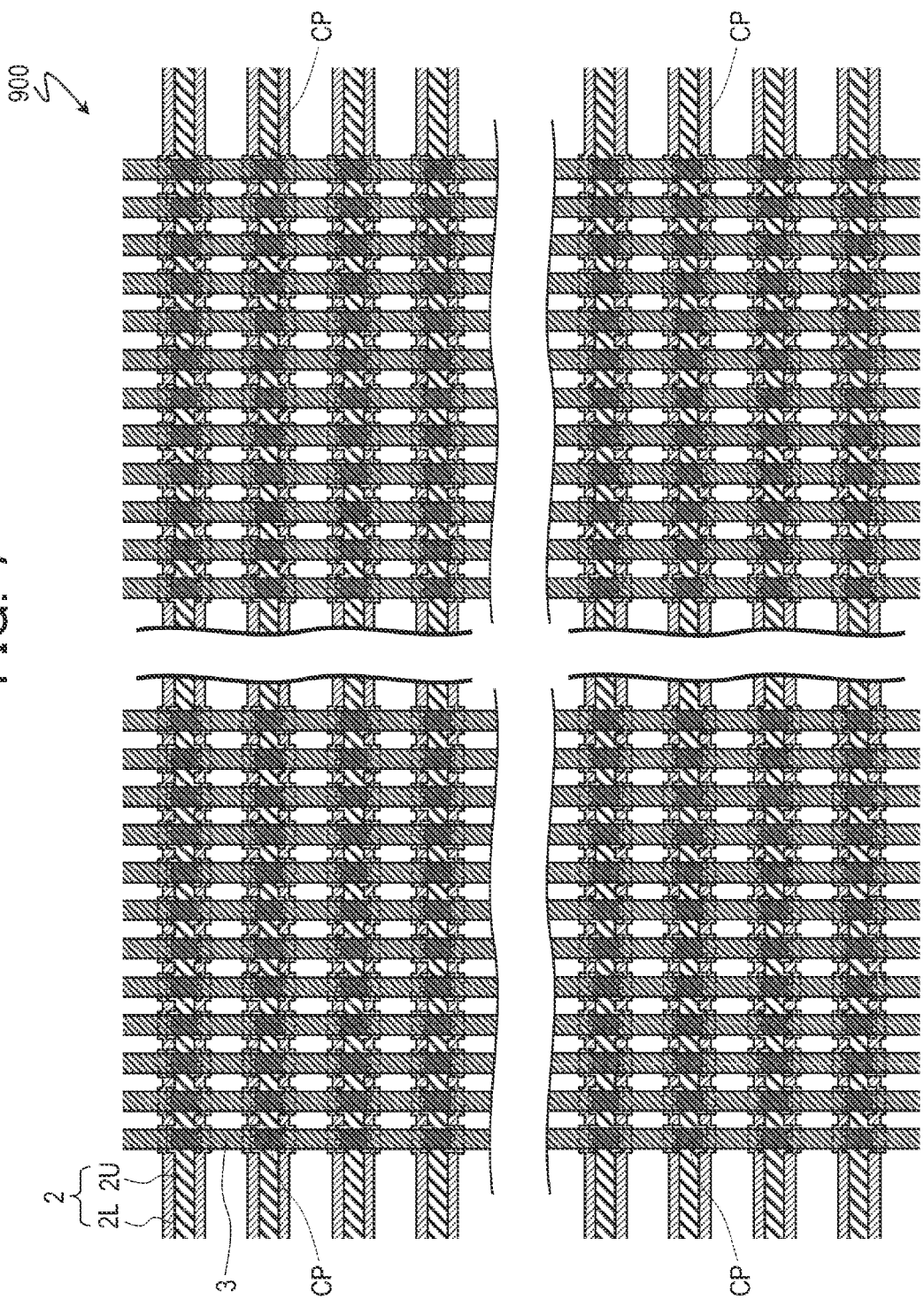
FIG. 7 is a diagram showing an example of arrangement of contact portions in an active matrix substrate of Comparative Example 2.

In the active matrix substrate 900 of Comparative Example 2, as shown in FIG. 7, the contact portions CP are provided in all intersection regions. That is, the contact portions CP are provided corresponding to all the pixels. Therefore, in a case where the number of the gate wirings 2 is defined as m and the number of the source wirings 3 is defined as n, each gate wiring 2 includes n contact portions CP, and m contact portions CP overlap each source wiring 3.

As in the active matrix substrate 800 of Comparative Example 1, in a case where the contact portions CP are disposed only on both end portions of the gate wiring 2, delay of a gate signal occurs in a central portion of the display region. In addition, as in the active matrix substrate 900 of Comparative Example 2, in a case where the contact portion CP is disposed for each pixel, load capacitance of the source wiring 3 increases or an aperture ratio of a pixel decreases.

On the other hand, in the active matrix substrate 100 of the present embodiment, the number of contact portions CP of each gate wiring 2 is more (3 or more) than a case where the contact portions CP are provided only on both end portions of the gate wiring 2, and accordingly, the delay of the gate signal in the central portion of the display region DR is suppressed. From a viewpoint of suppressing the delay of the gate signal, the number of contact portions CP of each gate wiring 2 is preferably 20 or more, and more preferably 40 or more.

As described above, the contact portion CP causes a decrease in the aperture ratio. Therefore, for the purpose for a high aperture ratio (for example, a high-definition device), as in the present embodiment, it is preferable that the contact portion CP is disposed in the intersection region (region where the gate wiring 2 and the source wiring 3 intersect each other). Accordingly, the decrease in the aperture ratio due to the contact portion CP is suppressed. However, in a case where the contact portion CP is disposed in the intersection region, there is a risk that an overlapping area of the source wiring 3 and the gate wiring 2 increases to increase the load capacitance of the source wiring 3.

In the active matrix substrate 100 of the present embodiment, the number of contact portions CP of each gate wiring 2 and the number of contact portions CP overlapping each source wiring 3 are less than (less than n and less than m, respectively) that in a case where the contact portion CP is provided in each pixel P. Accordingly, the increase in the load capacitance of the source wiring 3 or the decrease in the aperture ratio of the pixel P is suppressed. From a viewpoint of suppressing the increase in the load capacitance of the source wiring 3, the number of contact portions CP overlapping each source wiring 3 is preferably 20 or less and more preferably 10 or less. In addition, in comparison with the number of gate wirings 2, the number of contact portions CP overlapping each source wiring 3 is preferably 18 or less and more preferably 0.1% or less of the number of gate wirings 2.

The number of contact portions CP overlapping each source wiring 3 is preferably the same as each other. In a case where the number of contact portions CP overlapping each source wiring 3 is the same as each other, the load capacitance of each source wiring 3 is substantially the same as each other. Accordingly, occurrence of display unevenness due to a variation in the load capacitance of each source wiring 3 is suppressed.

Here, the number of contact portions CP included in each gate wiring 2 is defined as p, the number of contact portions CP overlapping each source wiring 3 is defined as q, and a greatest common divisor of the number m of the gate wirings 2 and the number n of the source wirings 3 is defined as GCD. In this case, p and q are set so that relationships of p=q/GCD and q=p/GCD are satisfied (that is, p is a number obtained by dividing q by GCD, and q is a number obtained by dividing p by GCD). Accordingly, the number of contact portions CP overlapping each source wiring 3 may be set to be the same as each other.

For example, in a case where the number m of gate wirings 2 is 2400 and the number n of source wirings 3 is 11520, the greatest common divisor GCD thereof is 480. Therefore, the number p of contact portions CP included in each gate wiring 2 may be set to 24 (=11520/480), and the number q of contact portions CP overlapping each source wiring 3 may be set to 5 (=2400/480).

Here, an example of a method of manufacturing the active matrix substrate 100 of the present embodiment will be described with reference to FIGS. 8A to 8K. FIGS. 8A to 8K are step sectional views showing manufacturing steps of the active matrix substrate 100. Each of FIGS. 8A to 8K shows a cross section corresponding to FIG. 3 on the left side and shows a cross section corresponding to FIG. 4 on the right side.

First, as shown in FIG. 8A, the lower gate electrode 11 and the lower gate wiring 2L are formed on the substrate 1. For example, after depositing a conductive film by a sputtering method, the lower gate electrode 11 and the lower gate wiring 2L can be formed by patterning the conductive film by a photolithography process.

As the substrate 1, for example, a glass substrate, a silicon substrate, a plastic substrate having heat resistance (a resin substrate), or the like can be used. As a conductive film (lower gate metal film) for forming the lower gate electrode 11 and the lower gate wiring 2L, a film containing a metal such as aluminum (Al), tungsten (W), molybdenum (Mo), tantalum (Ta), chromium (Cr), titanium (Ti), or and copper (Cu), an alloy thereof, or a metal nitride thereof can be appropriately used. In addition, a laminated film obtained by laminating the plurality of films may be used. Here, a film in which a tantalum nitride (TaN) film and a W film are laminated in this order is used as the lower gate metal film. A thickness of the lower gate metal film is, for example, 100 nm or more and 500 nm or less.

Figure 8B:
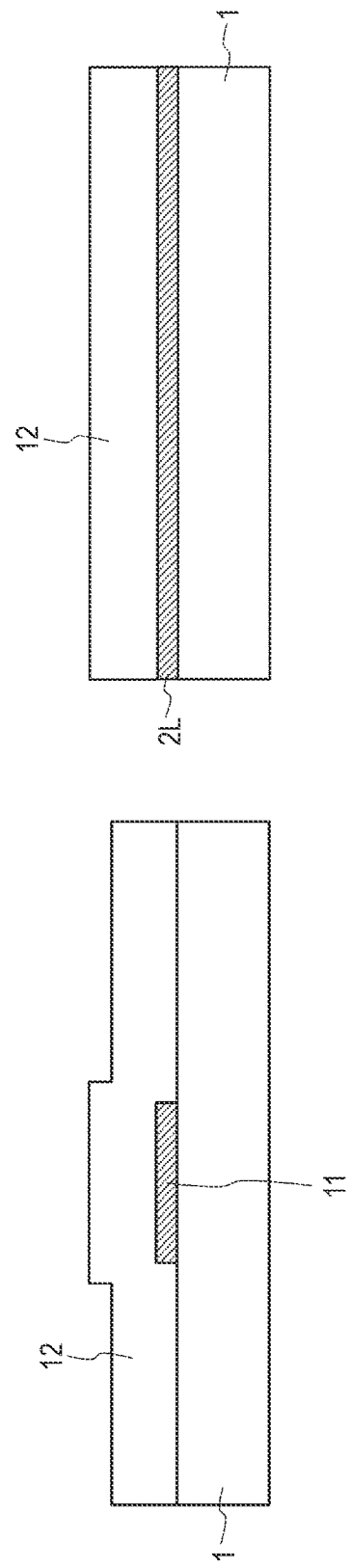
FIG. 8B is a step sectional view showing a manufacturing step of an active matrix substrate.

Next, as shown in FIG. 8B, the lower gate insulating layer 12 covering the lower gate electrode 11 and the lower gate wiring 2L is formed. The lower gate insulating layer 12 can be formed by, for example, a CVD method. As the lower gate insulating layer 12, a silicon oxide ($SiO_2$) layer, a silicon nitride (SiNx) layer, a silicon oxynitride (SiOxNy; x>y) layer, a silicon nitride oxide (SiNxOy; x>y) layer, or the like can be appropriately used. The lower gate insulating layer 12 may have a laminated structure. For example, a SiNx layer for preventing spread of impurities and the like from the substrate 1 may be formed as a lower layer on the substrate 1 side, and a $SiO_2$ layer for ensuring the insulating property may be formed as an upper layer thereon. A thickness of the lower gate insulating layer 12 is, for example, 150 nm or more and 400 nm or less.

Figure 8C:
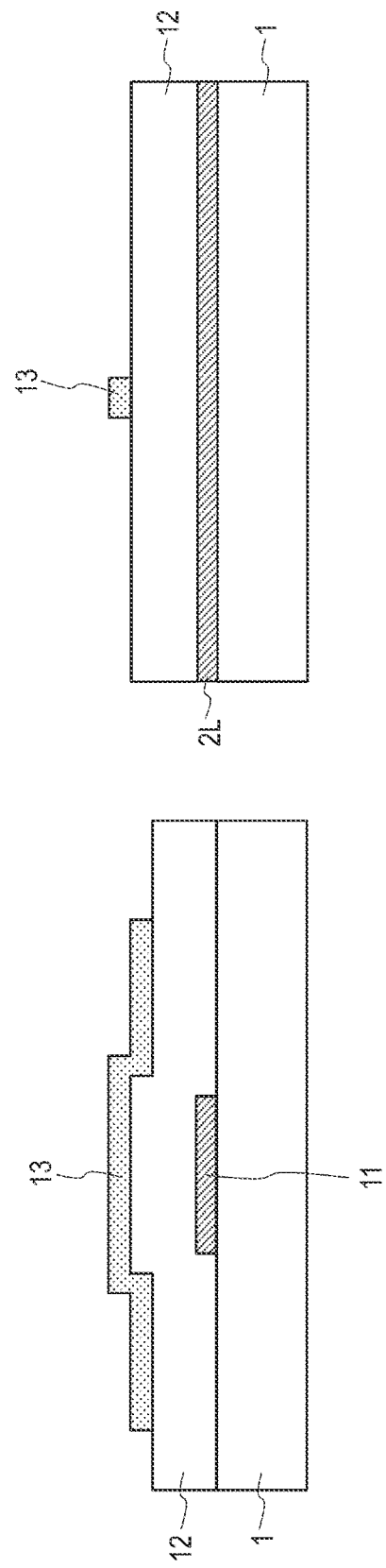
FIG. 8C is a step sectional view showing a manufacturing step of an active matrix substrate.

Next, as shown in FIG. 8C, the oxide semiconductor layer 13 is formed on the lower gate insulating layer 12. For example, after depositing an oxide semiconductor film by the sputtering method, the island-shaped oxide semiconductor layer 13 can be formed by patterning the oxide semiconductor film by the photolithography process. The oxide semiconductor layer 13 is formed to face the lower gate electrode 11 via the lower gate insulating layer 12. Here, as the oxide semiconductor layer 13, an In—Ga—Zn—O-based semiconductor layer having a composition ratio of In:Ga:Zn=1:1:1 is formed. A thickness of the oxide semiconductor layer 13 is, for example, 10 nm or more and 60 nm or less.

Figure 8D:
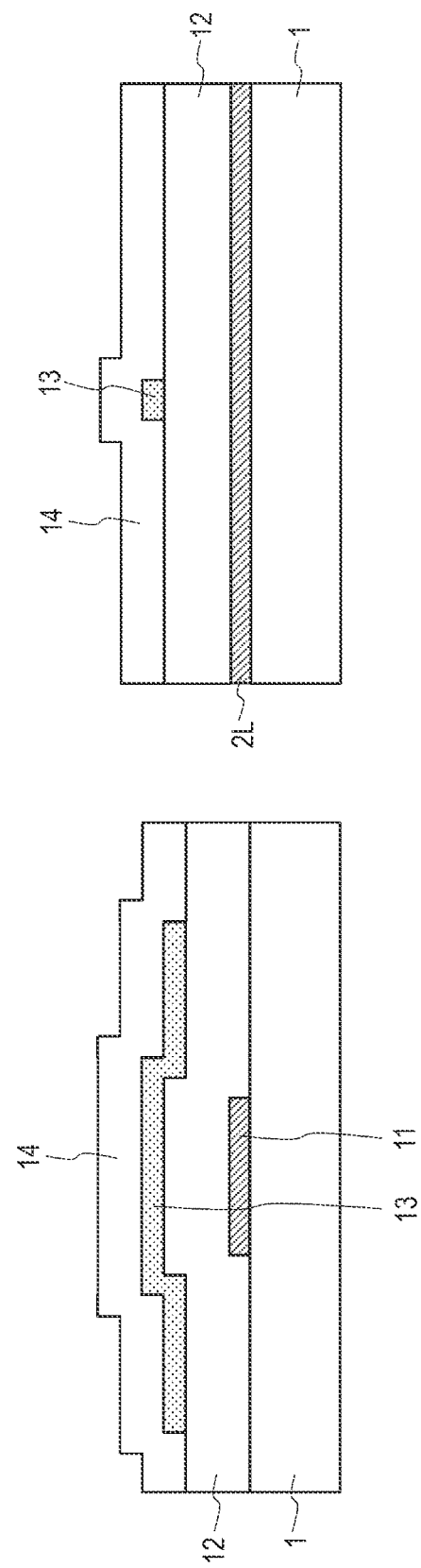
FIG. 8D is a step sectional view showing a manufacturing step of an active matrix substrate.

Next, as shown in FIG. 8D, the upper gate insulating layer 14 is deposited to cover the oxide semiconductor layer 13. The upper gate insulating layer 14 is deposited by, for example, the CVD method. Thereafter, an oxidation treatment (for example, baking or peroxide treatment) of the oxide semiconductor layer 13 is performed. As the upper gate insulating layer 14, for example, an insulating layer similar to the lower gate insulating layer 12 (exemplified as the lower gate insulating layer 12) can be used. Here, a silicon oxide ($SiO_2$) layer is formed as the upper gate insulating layer 14. When an oxide layer such as a silicon oxide layer is used as the upper gate insulating layer 14, since oxidation deficiency generated in the channel region 13c of the oxide semiconductor layer 13 can be reduced by the oxide layer, resistance reduction of the channel region can be suppressed. A thickness of the upper gate insulating layer 14 is, for example, 50 nm or more and 150 nm or less.

Figure 8E:
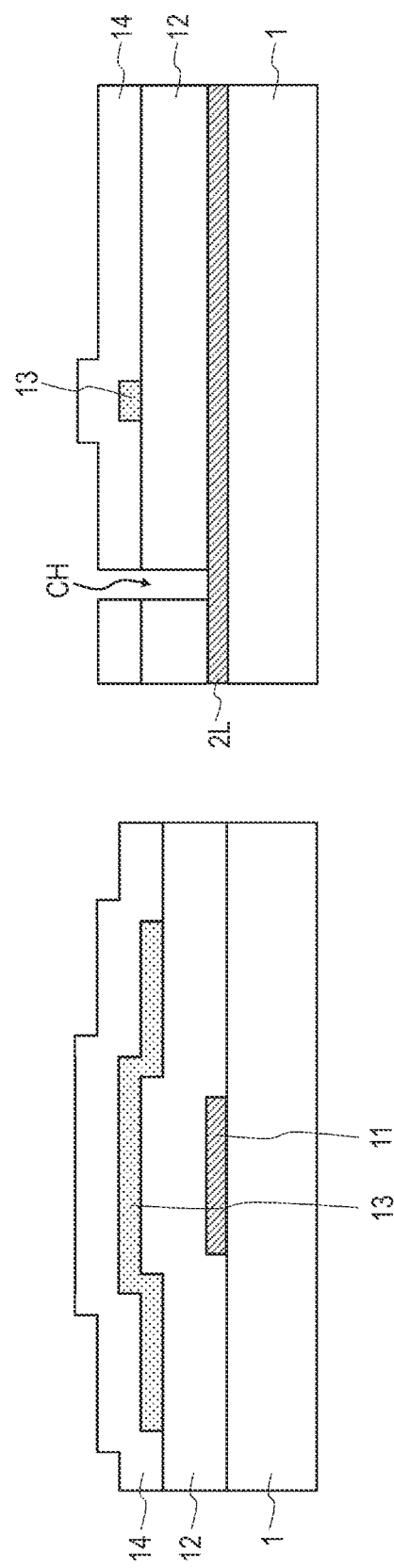
FIG. 8E is a step sectional view showing a manufacturing step of an active matrix substrate.

Next, as shown in FIG. 8E, the contact hole CH is formed in the lower gate insulating layer 12 and the upper gate insulating layer 14 so that a portion of the lower gate wiring 2L is exposed. The contact hole CH can be formed, for example, by patterning the lower gate insulating layer 12 and the upper gate insulating layer 14 in the photolithography process.

Figure 8F:
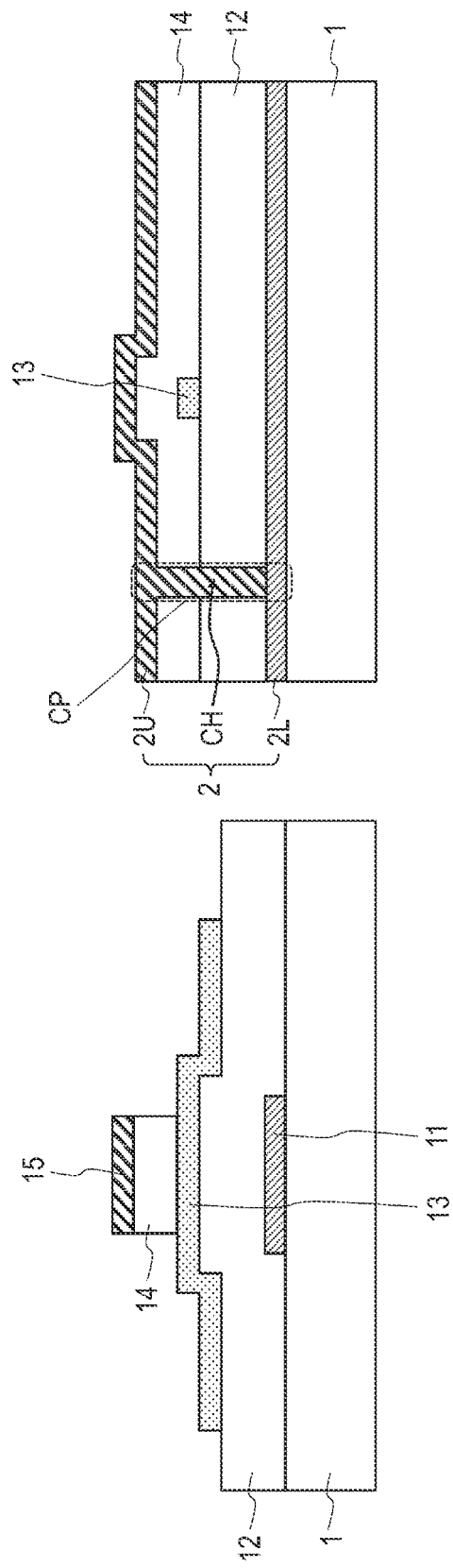
FIG. 8F is a step sectional view showing a manufacturing step of an active matrix substrate.

Next, as shown in FIG. 8F, the upper gate electrode 15 and the upper gate wiring 2U are formed on the upper gate insulating layer 14. For example, after depositing a conductive film (upper gate metal film) by a sputtering method, the upper gate electrode 15 and the upper gate wiring 2U can be formed by patterning the upper gate metal film by the photolithography process. Thereafter, the upper gate insulating layer 14 is patterned. The upper gate insulating layer 14 can be patterned collectively with the upper gate metal film. As the upper gate metal film, a film containing a metal such as aluminum (Al), tungsten (W), molybdenum (Mo), tantalum (Ta), chromium (Cr), titanium (Ti), or and copper (Cu), an alloy thereof, or a metal nitride thereof can be used. Here, a film in which a Ti film, an Al film, and a Ti film are laminated in this order is used as the upper gate metal film. A thickness of the upper gate metal film is, for example, 100 nm or more and 400 nm or less.

Thereafter, a resistance reduction treatment of the oxide semiconductor layer 13 may be performed as a mask of the upper gate insulating layer 14 and the upper gate electrode 15. For example, as the resistance reduction treatment, a plasma treatment can be used. By the resistance reduction treatment, a region of the oxide semiconductor layer 13 not overlapping the upper gate insulating layer 14 and the upper gate electrode 15 (region to be the source contact region 13s and the drain contact region 13d) is a low resistance region having a lower specific resistance than that of the region of the oxide semiconductor layer 13 overlapping the upper gate insulating layer 14 and the upper gate electrode 15 (region to be the channel region 13c). The low resistance region may be a conductor region (for example, sheet resistance: 200Ω/ or less). A plasma treatment may be performed using the upper gate electrode 15 as a mask without patterning the upper gate insulating layer 14. In that case, since the photolithography process of the upper gate insulating layer 14 can be omitted, it is possible to shorten the manufacturing process. In addition, the method of resistance reduction treatment is not limited to the plasma treatment. For example, an exposure region of the oxide semiconductor layer 13 can also be subjected to the resistance reduction by bringing into contact with a reducing insulating film capable of reducing an oxide semiconductor. Alternatively, the resistance reduction can also be performed by an ion injection treatment such as ion doping on the oxide semiconductor layer 13, for example. In this case as well, since the ion injection treatment can be performed through the upper gate insulating layer 14, the process can be shortened.

Figure 8G:
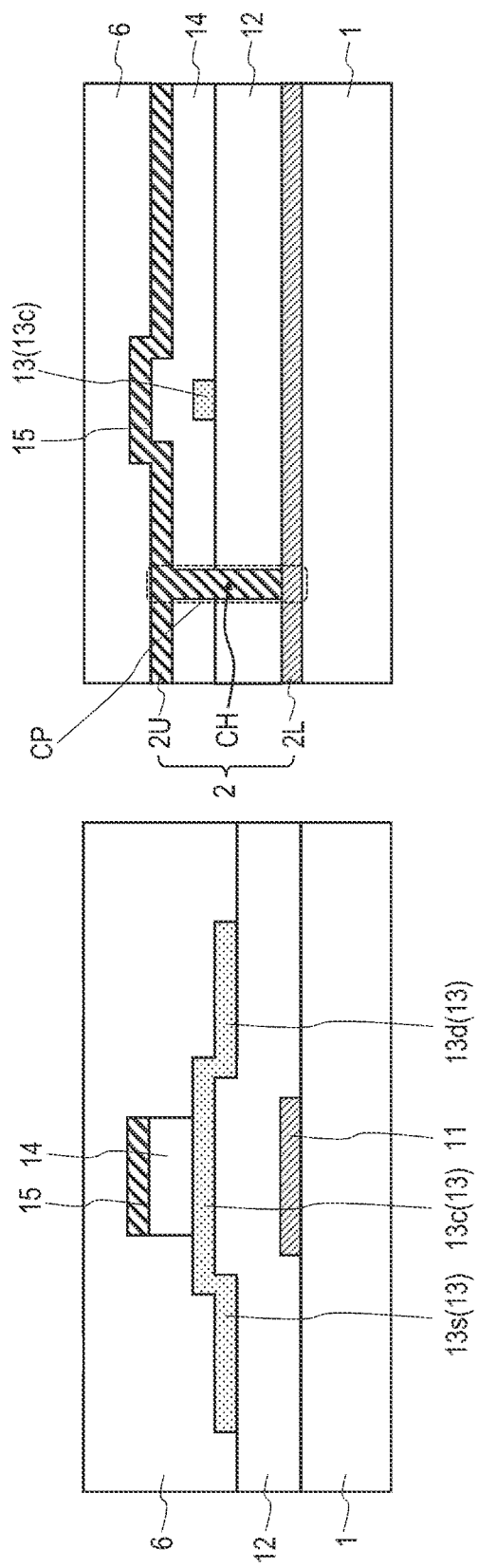
FIG. 8G is a step sectional view showing a manufacturing step of an active matrix substrate.

Next, as shown in FIG. 8G, the interlayer insulating layer 6 covering the oxide semiconductor layer 13, the upper gate electrode 15, and the upper gate wiring 2U is formed. The interlayer insulating layer 6 can be formed by, for example, the CVD method. As the interlayer insulating layer 6, inorganic insulating layers such as a silicon oxide ($SiO_2$) layer, a silicon nitride (SiNx) layer, a silicon oxynitride (SiOxNy; x>y) layer, a silicon nitride oxide (SiNxOy; x>y) layer, or the like can be used as a single layer or by laminating the inorganic insulating layers. A thickness of the interlayer insulating layer 6 is, for example, 200 nm or more and 700 nm or less. Here, a silicon oxide layer is used as the interlayer insulating layer 6.

Figure 8H:
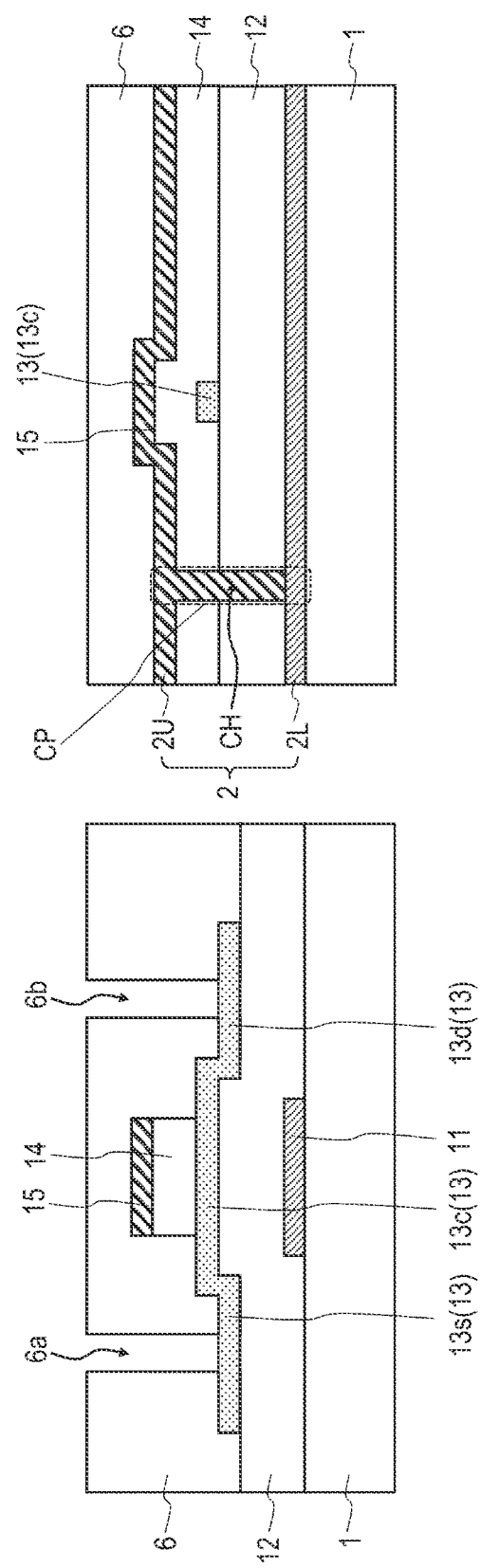
FIG. 8H is a step sectional view showing a manufacturing step of an active matrix substrate.

Next, as shown in FIG. 8H, the source contact hole 6a and the drain contact hole 6b are formed in the interlayer insulating layer 6 so that a portion of the source contact region 13s and a portion of the drain contact region 13d of the oxide semiconductor layer 13 are exposed. The source contact hole 6a and the drain contact hole 6b can be formed, for example, by patterning the interlayer insulating layer 6 in the photolithography process.

Figure 8I:
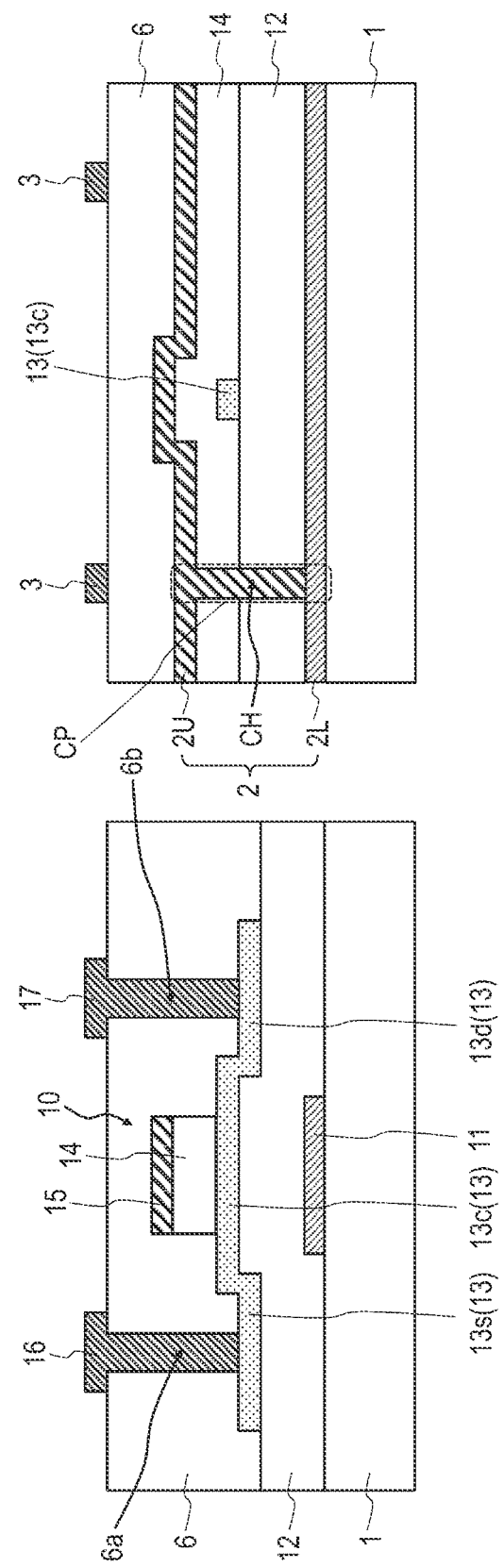
FIG. 8I is a step sectional view showing a manufacturing step of an active matrix substrate.

Next, as shown in FIG. 8I, the source electrode 16, the drain electrode 17, and the source wiring 3 are formed on the interlayer insulating layer 6. For example, after depositing a conductive film by a sputtering method, the source electrode 16, the drain electrode 17, and the source wiring 3 can be formed by patterning the conductive film by the photolithography process. As a conductive film (source metal film) for forming the source electrode 16, the drain electrode 17, and the source wiring 3, a film containing a metal such as aluminum (Al), tungsten (W), molybdenum (Mo), tantalum (Ta), copper (Cu), chromium (Cr), or titanium (Ti), an alloy thereof, or a metal nitride thereof can be appropriately used. In addition, a laminated film obtained by laminating the plurality of films may be used. Here, a film in which a Ti film, an Al film, and a Ti film are laminated in this order is used as the source metal film. A thickness of the source metal film is, for example, 200 nm or more and 700 nm or less.

Figure 8J:
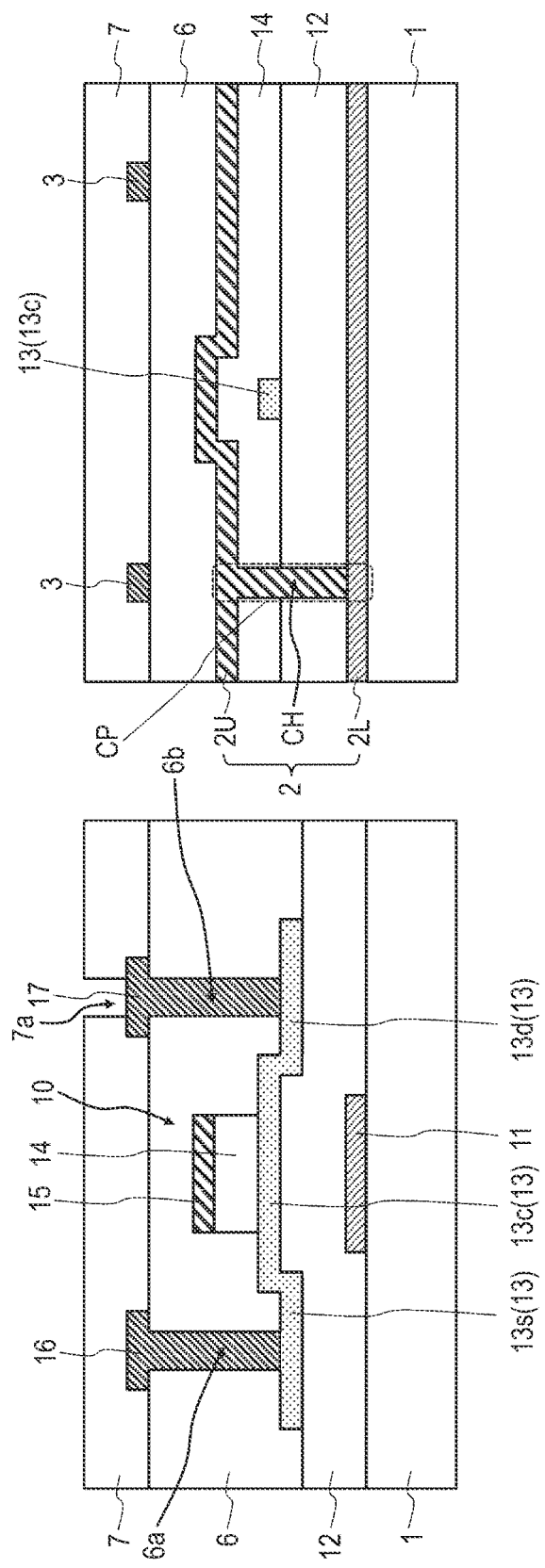
FIG. 8J is a step sectional view showing a manufacturing step of an active matrix substrate.

Next, as shown in FIG. 8J, the flattening layer 7 that covers the pixel TFT 10 is formed. For example, the flattening layer 7 in which the pixel contact hole 7a is formed so that a portion of the drain electrode 17 is exposed can be obtained by applying, exposing, and developing a photosensitive resin material. As the photosensitive resin material, for example, a photosensitive acrylic resin can be used. A thickness of the flattening layer 7 is, for example, approximately 2.0 μm to 3.0 μm.

Figure 8K:
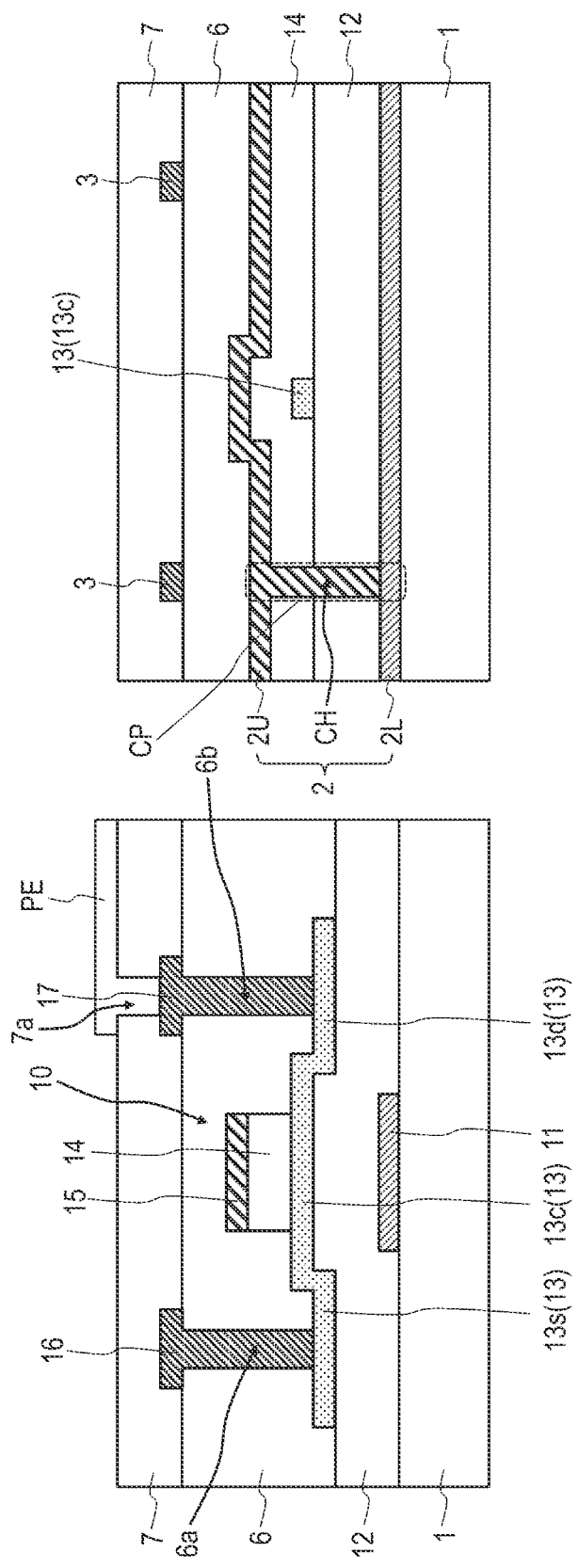
FIG. 8K is a step sectional view showing a manufacturing step of an active matrix substrate.

Next, as shown in FIG. 8K, the pixel electrode PE is formed on the flattening layer 7. For example, after depositing a transparent conductive film by a sputtering method, the pixel electrode PE can be formed by patterning the transparent conductive film by the photolithography process. As the transparent conductive material for forming the pixel electrode PE, for example, indium tin oxide (ITO) or indium zinc oxide (IZO) can be used. Here, indium zinc oxide is used. A thickness of the pixel electrode PE is, for example, 30 nm or more and 100 nm or less. As described above, the active matrix substrate 100 is obtained.

Embodiment 2

Figure 9:
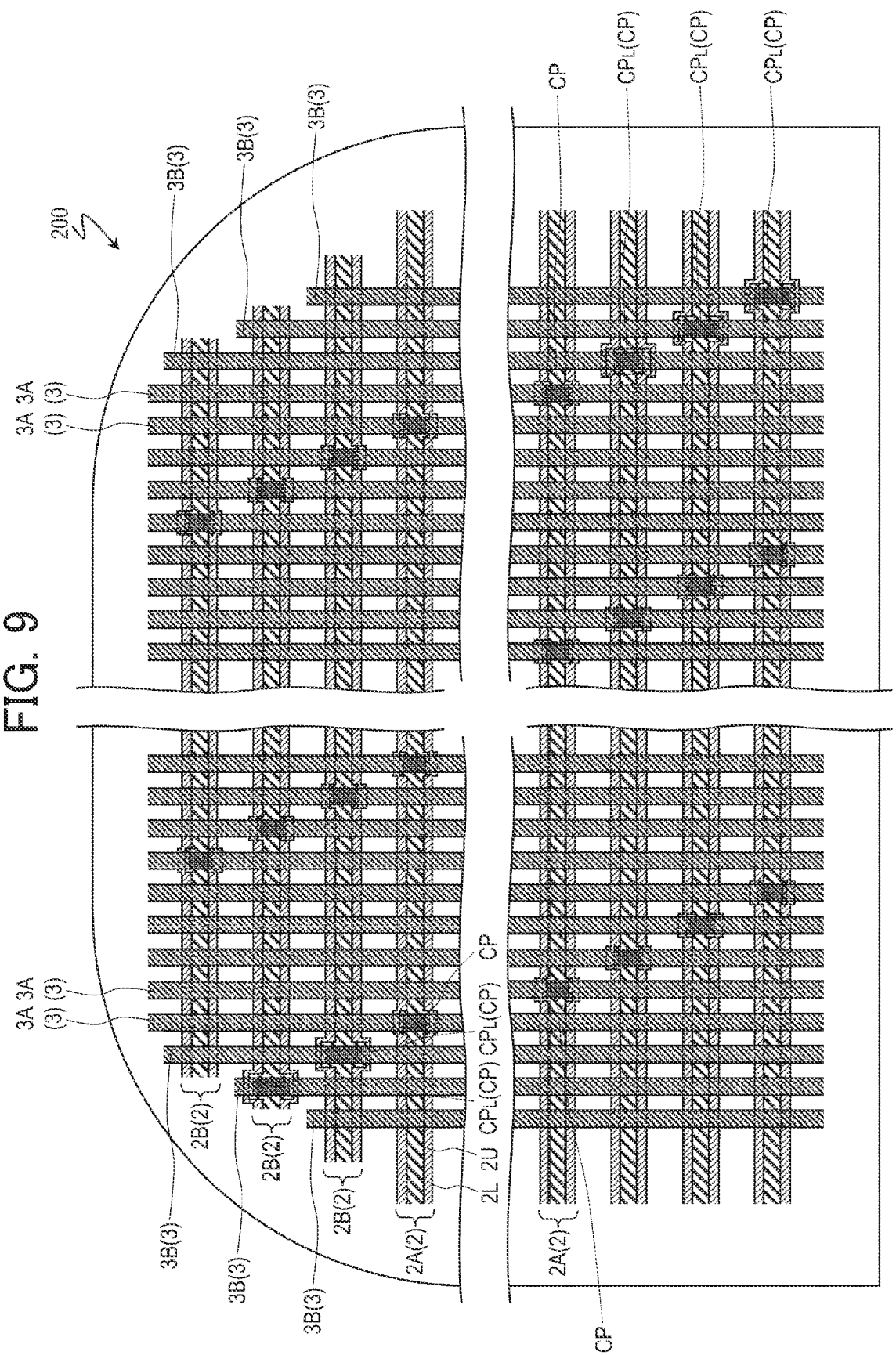
FIG. 9 is a plan view schematically showing another active matrix substrate according to an embodiment of the present disclosure.

An active matrix substrate 200 of the present embodiment will be described with reference to FIG. 9. FIG. 9 is a plan view schematically showing the active matrix substrate 200. Hereinafter, the differences of the active matrix substrate 200 from the active matrix substrate 100 of Embodiment 1 will be mainly described.

The active matrix substrate 200 does not have a strictly rectangular shape. In the example shown in the drawing, the active matrix substrate 200 has a rectangular shape in which upper right and upper left corners are rounded and cut out. In the specification of the present application, a substrate that is not in a strictly rectangular shape is referred to as an "irregular substrate".

As described above, the active matrix substrate 200 is an irregular substrate. Therefore, the plurality of gate wirings 2 include gate wirings 2 shorter than other gate wirings 2. Hereinafter, a relatively long gate wiring 2A is referred to as a "first gate wiring", and a relatively short (that is, shorter than the first gate wiring 2A) gate wiring 2B is referred to as a "second gate wiring". In the example shown in FIG. 9, the second gate wiring 2B is provided near an upper end of the active matrix substrate 200.

In addition, the plurality of source wirings 3 include a source wiring 3 shorter than other source wirings 3. Hereinafter, a relatively long source wiring 3A is referred to as a "first source wiring", and a relatively short (that is, shorter than the first source wiring 3A) source wiring 3B is referred to as a "second source wiring". In the example shown in FIG. 9, the second source wiring 3B is provided near a left end and a right end of the active matrix substrate 200.

In the present embodiment, at least one contact portion CP overlapping each second source wiring 3B includes a contact portion $CP_L$ having an area larger than an area of each of the at least one contact portion CP overlapping each first source wiring 3A.

In the active matrix substrate 200 which is an irregular substrate, since the second source wiring 3B is shorter than the first source wiring 3A, the number of contact portions CP overlapping the second source wiring 3B may be less than the number of contact portions CP overlapping the first source wiring 3A. As in the present embodiment, as the contact portion CP overlapping the second source wiring 3B includes the contact portion $CP_L$ described above, a magnitude of load capacitance of the second source wiring 3B can be brought close to (for example, substantially the same as) a magnitude of load capacitance of the first source wiring 3A. Accordingly, it is possible to suppress the occurrence of display unevenness due to the variation of the load capacitance of each source wiring 3.

Oxide Semiconductor

The oxide semiconductor included in the oxide semiconductor layer 13 may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor in which a c-axis is aligned substantially perpendicular to a layer surface.

The oxide semiconductor layer 13 may have a laminated structure of two or more layers. The oxide semiconductor layer 13 having a laminated structure may include an amorphous oxide semiconductor layer and a crystalline oxide semiconductor layer, or may include a plurality of crystalline oxide semiconductor layers having different crystal structures. The oxide semiconductor layer 13 having a laminated structure may include a plurality of amorphous oxide semiconductor layers. In a case where the oxide semiconductor layer 13 has a laminated structure, energy gaps between layers may be different from each other.

Materials, structures, film formation methods, configurations of oxide semiconductor layers having a laminated structure, and the like of the amorphous oxide semiconductor and each of the above crystalline oxide semiconductors are disclosed in, for example, Japanese Unexamined Patent Application Publication No. 2014-007399. For reference, the entire contents disclosed in Japanese Unexamined Patent Application Publication No. 2014-007399 are incorporated herein.

The oxide semiconductor layer 13 may include, for example, at least one metal element among In, Ga, or Zn. In the present embodiment described above, the oxide semiconductor layer 13 includes, for example, an In—Ga—Zn—O-based semiconductor (for example, indium gallium zinc oxide). Here, the In—Ga—Zn—O-based semiconductor is a ternary oxide of indium (In), gallium (Ga), and zinc (Zn), a ratio (composition ratio) of In, Ga, and Zn is not particularly limited, and includes, for example, In:Ga:Zn=2:2:1, In:Ga:Zn=1:1:1, In:Ga:Zn=1:1:2, and the like. Such an oxide semiconductor layer 13 can be formed of an oxide semiconductor film including an In—Ga—Zn—O-based semiconductor.

The In—Ga—Zn—O-based semiconductor may be amorphous or crystalline. As the crystalline In—Ga—Zn—O-based semiconductor, a crystalline In—Ga—Zn—O-based semiconductor in which the c-axis is aligned substantially perpendicular to the layer surface is preferable.

The crystal structure of a crystalline In—Ga—Zn—O-based semiconductor is disclosed in, for example, above Japanese Unexamined Patent Application Publication No. 2014-007399, Japanese Unexamined Patent Application Publication No. 2012-134475, and Japanese Unexamined Patent Application Publication No. 2014-209727. For reference, the entire contents disclosed in Japanese Unexamined Patent Application Publication No. 2012-134475 and Japanese Unexamined Patent Application Publication No. 2014-209727 are incorporated herein. A TFT having an In—Ga—Zn—O-based semiconductor layer has high mobility (more than 20 times that of an a-Si TFT) and low leak current (less than 1/100 that of an a-Si TFT). Therefore, the TFT is suitably used as a driving TFT (for example, TFT included in a drive circuit provided on the same substrate as a display region around a display region including a plurality of pixels) and a pixel TFT (TFT provided in a pixel).

The oxide semiconductor layer 13 may include another oxide semiconductor instead of the In—Ga—Zn—O-based semiconductor. For example, an In—Sn—Zn—O-based semiconductor (for example, $In_2O_3$-$SnO_2$-$ZnO$; InSnZnO) may be included. The In—Sn—Zn—O-based semiconductor is a ternary oxide of indium (In), tin (Sn), and zinc (Zn). Alternatively, the oxide semiconductor layer 13 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a cadmium oxide (CdO), Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, and the like.

Liquid Crystal Display Device

Figure 10:
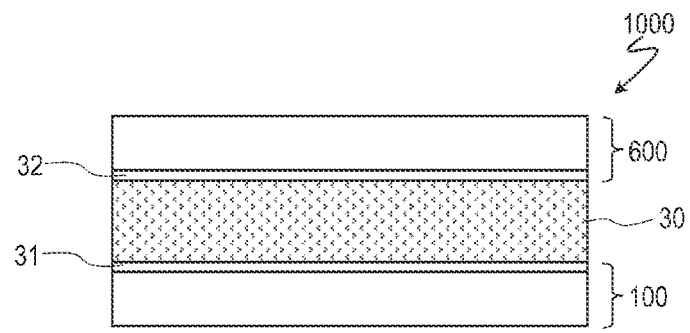
FIG. 10 is a cross-sectional view schematically showing a liquid crystal display device including an active matrix substrate according to an embodiment of the present disclosure.

The active matrix substrates 100 and 200 according to the embodiments of the present disclosure can be suitably used for a liquid crystal display device. FIG. 10 shows an example of the liquid crystal display device.

A liquid crystal display device 1000 shown in FIG. 10 includes the active matrix substrate 100 (or the active matrix substrate 200), a counter substrate 600 provided to face the active matrix substrate 100, and a liquid crystal layer 30 provided between the active matrix substrate 100 and the counter substrate 600. Alignment films 31 and 32 are provided on outermost surfaces of the active matrix substrate 100 and the counter substrate 600 on the liquid crystal layer 30 side, respectively. The counter substrate 600 typically includes a color filter layer and a black matrix (both not shown).

A thickness (cell gap) of the liquid crystal layer 30 is defined by a columnar spacer (not shown) provided on the liquid crystal layer 30 side of the counter substrate 600.

A display mode of the liquid crystal display device 1000 may be various well-known display modes. Specifically, the display mode may be a vertical electric field mode such as a twisted nematic (TN) mode or a vertical alignment (VA) mode, or may be a horizontal electric field mode such as a fringe field switching (FFS) mode. The common electrode CE is provided on the counter substrate 600 in the vertical electric field mode, whereas the common electrode CE is provided on the active matrix substrate 100 in the horizontal electric field mode.

INDUSTRIAL APPLICABILITY

The embodiments of the present disclosure can be used for active matrix substrates for various display devices, and can be suitably used for active matrix substrates for high-definition liquid crystal display devices, for example.

The present disclosure contains subject matter related to that disclosed in Japanese Priority Patent Application JP 2023-027919 filed in the Japan Patent Office on Feb. 27, 2023, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate having a display region defined by a plurality of pixel regions arranged in a matrix including a plurality of rows and a plurality of columns, the active matrix substrate comprising:
   a substrate;
   a pixel TFT that is supported by the substrate and provided corresponding to each of the plurality of pixel regions;
   a pixel electrode that is electrically connected to the pixel TFT;
   a plurality of gate wirings extending in a row direction, each of which supplies a gate signal to a corresponding pixel TFT; and
   a plurality of source wirings extending in a column direction, each of which supplies a source signal to a corresponding pixel TFT,
   wherein the pixel TFT includes
   a lower gate electrode that is provided on the substrate,
   a lower gate insulating layer that covers the lower gate electrode,
   an oxide semiconductor layer provided on the lower gate insulating layer and including a channel region facing the lower gate electrode via the lower gate insulating layer, and a source contact region and a drain contact region positioned on both sides of the channel region,
   an upper gate insulating layer that is provided on the channel region of the oxide semiconductor layer, and
   an upper gate electrode that is provided on the upper gate insulating layer and faces the channel region of the oxide semiconductor layer via the upper gate insulating layer,
   each gate wiring has a multilayer structure including a lower gate wiring electrically connected to the lower gate electrode and an upper gate wiring electrically connected to the upper gate electrode, and
   in a case where the number of the plurality of gate wirings is defined as m and the number of the plurality of source wirings is defined as n, each of the gate wirings has 3 or more and less than n contact portions in which the lower gate wiring and the upper gate wiring are electrically connected to each other, each contact portion is positioned in any of n intersection regions in which the gate wiring and the plurality of source wirings intersect each other, and the number of the contact portions overlapping each source wiring is less than m.

2. The active matrix substrate according to claim 1, wherein the number of the contact portions overlapping each source wiring is 20 or less.

3. The active matrix substrate according to claim 1, wherein the number of the contact portions overlapping each of the source wiring is 1% or less of the number of plurality of gate wirings.

4. The active matrix substrate according to claim 1, wherein the number of the contact portions overlapping each source wiring is the same.

5. The active matrix substrate according to claim 4, wherein, in a case where the number of the contact portions included in each gate wiring is defined as p, the number of the contact portions overlapping each source wiring is defined as q, and a greatest common divisor of the number m of the plurality of gate wirings and the number n of the plurality of source wirings is defined as GCD,
relationships of p=q/GCD and q=p/GCD are satisfied.

6. The active matrix substrate according to claim 1, wherein the plurality of source wirings include a first source wiring, and a second source wiring shorter than the first source wiring, and
at least one contact portion overlapping the second source wiring includes a contact portion having an area larger than an area of each of at least one contact portion overlapping the first source wiring.

7. The active matrix substrate according to claim 1, wherein the oxide semiconductor layer includes an In—Ga—Zn—O-based semiconductor.

8. The active matrix substrate according to claim 7, wherein the In—Ga—Zn—O-based semiconductor includes a crystalline portion.

9. A liquid crystal display device comprising:
the active matrix substrate according to claim 1;
a counter substrate provided to face the active matrix substrate; and
a liquid crystal layer provided between the active matrix substrate and the counter substrate.

* * * * *